US012696408B2

(12) United States Patent
Kuan et al.

(10) Patent No.: US 12,696,408 B2
(45) Date of Patent: Jul. 28, 2026

(54) PARTIALLY HOLLOW STRUCTURES FOR SECURITY BEZELS

(71) Applicant: Dell Products L.P., Round Rock, TX (US)

(72) Inventors: Yi-Hsin Kuan, Taipei (TW); Peter Timothy Clark, Taipei (TW); Patrick Vincent Illingworth, Austin, TX (US); James Utz, Georgetown, TX (US); Mario Alberto Rocha Rincon, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 235 days.

(21) Appl. No.: 18/496,246

(22) Filed: Oct. 27, 2023

(65) Prior Publication Data

US 2025/0142758 A1     May 1, 2025

(51) Int. Cl.
*H05K 7/14* (2006.01)

(52) U.S. Cl.
CPC ......... *H05K 7/1402* (2013.01); *H05K 7/1495* (2013.01)

(58) Field of Classification Search
CPC .. H05K 7/1402; H05K 7/1495; H05K 7/0208; G06F 1/181; G06F 1/182; G06F 1/16; G06F 1/20; G06F 1/187; G06F 1/184
See application file for complete search history.

(56) References Cited

U.S. PATENT DOCUMENTS

| | | | |
|---|---|---|---|
| 7,002,799 B2 | 2/2006 | Malone et al. | |
| 8,941,993 B2 | 1/2015 | Eckberg et al. | |
| 10,324,503 B1 * | 6/2019 | O'Donnell | H05K 9/0062 |
| 11,334,125 B1 * | 5/2022 | Crisp | G06F 1/20 |
| 11,723,167 B2 * | 8/2023 | Chen | G06F 1/181 361/679.02 |
| 2020/0030734 A1 * | 1/2020 | Hara | B01D 39/1692 |
| 2020/0333856 A1 * | 10/2020 | Quijano | G11B 33/146 |
| 2023/0128507 A1 * | 4/2023 | Clark | E05B 65/006 |
| 2023/0129135 A1 * | 4/2023 | Clark | H05K 5/0204 361/679.02 |
| 2023/0199994 A1 * | 6/2023 | Chen | G06F 1/181 361/679.02 |

* cited by examiner

*Primary Examiner* — Abhishek M Rathod
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a data processing system may include various hardware components. To secure the various hardware components, the data processing system may include a security bezel. The security bezel may for a chassis of the data processing system, the hardware components being positioned on an interior of the chassis. The security bezel may have a hollow cover body spanning a two-dimensional surface through which access to the interior is provided. The security bezel may further have a latch mechanism adapted to reversibly secure the hollow cover body to the chassis.

20 Claims, 5 Drawing Sheets

Data Processing System 100

Chassis 106

Power/Thermal Components 104

Electronics 102

PARTIALLY HOLLOW STRUCTURES FOR SECURITY BEZELS

FIELD

Embodiments disclosed herein relate generally to device management. More particularly, embodiments disclosed herein relate to managing security of devices.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
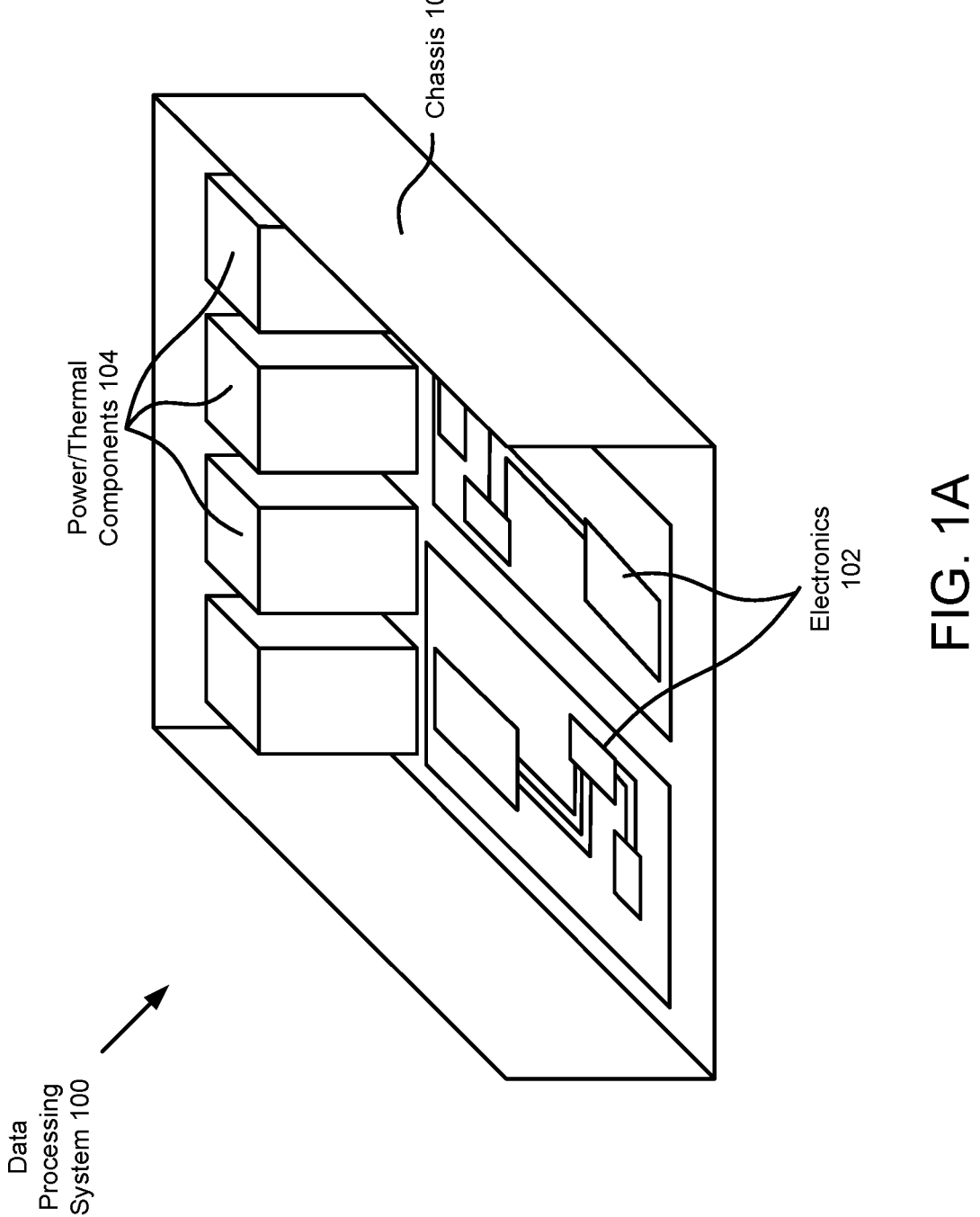
FIGS. 1A-1B show block diagrams illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for providing, at least in part, computer implemented services. To provide the services, a system may include any number of hardware components (e.g., storage devices, memory modules, processors, etc.). To facilitate placement and management of the hardware components, the hardware components may be positioned in a chassis. For example, the chassis may be a form factor compliant (e.g., a ½U sled) enclosure. The enclosure, to provide its functionality, may include an opening through which access to the hardware components is provided. For example, this access may facilitate insertion and/or removal of hot swap components and may facilitate airflow into and/or out of the enclosure.

Consequently, access to the hardware components provided by the opening may leave the hardware components vulnerable to compromise (e.g., due to theft and/or damage of the hardware components). If damaged, the hardware components may be prevented from providing various functionalities (on which the computer implemented services depend) as intended. Additionally, for example, the hardware components may be stolen using the access. Once removed, the stolen hardware components would not be capable of providing the various functionalities on which the computer implemented services depend. Thus, the vulnerability provided by the access may increase a likelihood of compromise of the computer implemented services.

To decrease the likelihood of compromise of the hardware components, the data processing system may include a security bezel to limit access to the hardware components. To do so, security bezel may be implemented as a hollow structure with homogenous composition (e.g., the structure may be made entirely of sheet metal). The structure may include various types of members to resist forces applied to the security bezel, and holes to facilitate the traversal of gases for thermal regulation of the hardware components.

This structure may be positioned on a two-dimensional surface that spans a distance across the opening of the enclosure. By doing so, security bezel 108 may limit access to the hardware components within the interior of the enclosure.

In an embodiment, a security bezel for a chassis of a data processing system is provided.

The security bezel may include hollow cover body adapted to secure access to an interior of the chassis, the hollow body enclosing a volume of space and spanning a two-dimensional surface through which access to the interior is provided; and a latch mechanism adapted to reversibly secure the hollow cover body to the chassis The security bezel may further include a lock mechanism operably coupled to the latch mechanism.

The hollow cover body may include a front body that has a same length as the hollow cover body, the front body may include: a first top connection member; a first structural frame; and a first bottom connection member; and a rear body that has the same length as the hollow cover body, the rear body may include: a second top connection member; a second structural frame; and a second bottom connection member.

The first top connection member may be connected to the second top connection member, and the first bottom connection member may be connected to the second bottom connection member.

The first structural frame is curved, and the second structural frame is flat.

The first structural frame may include: first holes: adapted to: allow a traversal of gasses through the surface; and may include: a first portion of a lock space in which the lock mechanism is positioned; and first structural members adapted to resist deformation due to force applied to the first structural members.

The second structural frame may include: second holes: adapted to allow a traversal of the gasses through the surface; that are aligned with the first holes; and may include a second portion of the lock space that is aligned with the first portion of the lock space to facilitate insertion of the lock mechanism into the lock space; and second structural members adapted to resist deformation due to force applied to the second structural members.

The first structural members may be stacked on top of the second structural members, and the first structural members may be disconnected from the second structural members.

Each of the second structural members are planar elements.

Each of the planar elements may have a substantially similar thickness to thicknesses of other planar elements.

The front body may be a first unitary structure of a substantially homogenous material.

The rear body may be a second unitary structure of the substantially homogenous material.

In an embodiment, a data processing system is provided that may include the security bezel as discussed above.

In an embodiment, an enclosure that may include the security bezel as discussed above is provided.

Turning to FIG. 1A, a diagram illustrating a data processing system in accordance with an embodiment is shown. The data processing system shown in FIG. 1A may provide computer implemented services. The computer implemented services may include any type and/or quantity of computer implemented services. For example, the computer implemented services may include data storage services, instant messaging services, database services, and/or any other type of service that may be implemented with a computing device.

To provide the computer implemented services, the data processing system may include various hardware components. These hardware components may facilitate various functionalities of a data processing system (e.g., 100). For example, to provide the computer implemented services, data processing system 100 may include electronics 102, power/thermal components 104, and chassis 106. Each of these is discussed below.

Electronics 102 may include various types of hardware components such as processors, memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 104 may power any of the components of data processing system 100 and/or thermally manage any of the components of data processing system 100. For example, power/thermal components 104 may include power supplies, fans, and/or other types of devices usable to power and/or thermally manage the components.

Any of the components of data processing system 100 may be positioned in chassis 106. Chassis 106 may include an enclosure in which physical structures of electronics 102 (e.g., processors, memory, etc.) and power/thermal components 104 (e.g., power supplies, fans, etc.) may be positioned. Chassis 106 may facilitate placement and management of electronics 102 and/or other components in a computing environment.

To facilitate the placement and management, the enclosure may include an opening (e.g., on a front side and/or a back side of chassis 106) through which access to the hardware components of data processing system 100 is provided. For example, this access may facilitate insertion and/or removal of hot swap components for chassis 106. Additionally, the opening may facilitate airflow into and/or out of chassis 106, thereby providing additional thermal management (e.g., cooling) for data processing system 100.

To provide its functionality, chassis 106 may be implemented with a form factor compliant (e.g., a ½U sled) enclosure usable to integrate data processing system 100 into a high-density computing environment, such as a rack mount chassis management system.

Consequently, access to the hardware components provided by the opening may leave data processing system 100 vulnerable to compromise (e.g., due to theft and/or damage of the hardware components). For example, a negligent and/or an incompetent individual may interact with the hardware components using the access, resulting in bent contact pins, ruptured liquid cooling tubes, and/or other physical damages caused by the individual. If damaged, the hardware components may be prevented from providing various functionalities (on which the computer implemented services depend) as intended.

Additionally, for example, the hardware components may be stolen from chassis 106 using the access. Once removed, the stolen hardware components would not be available to data processing system 100, and therefore, would not be capable of providing the various functionalities on which the computer implemented services depend.

Thus, the vulnerability provided by the access may increase a likelihood of compromise of the computer implemented services.

In general, embodiments disclosed herein relate to systems, methods, and devices for managing security of a data processing system. More particularly, embodiments disclosed herein may relate to security management of hardware components of a data processing system. The security of the hardware components may be managed to decrease a likelihood of compromise caused by access to the hardware components. To do so, the data processing system (e.g., 100) may include a security bezel as seen in FIG. 1B (discussed below).

While illustrated in FIG. 1A with a limited number of specific components, a data processing system may include additional, fewer, and/or different components without departing from embodiments disclosed herein.

Figure 1B:
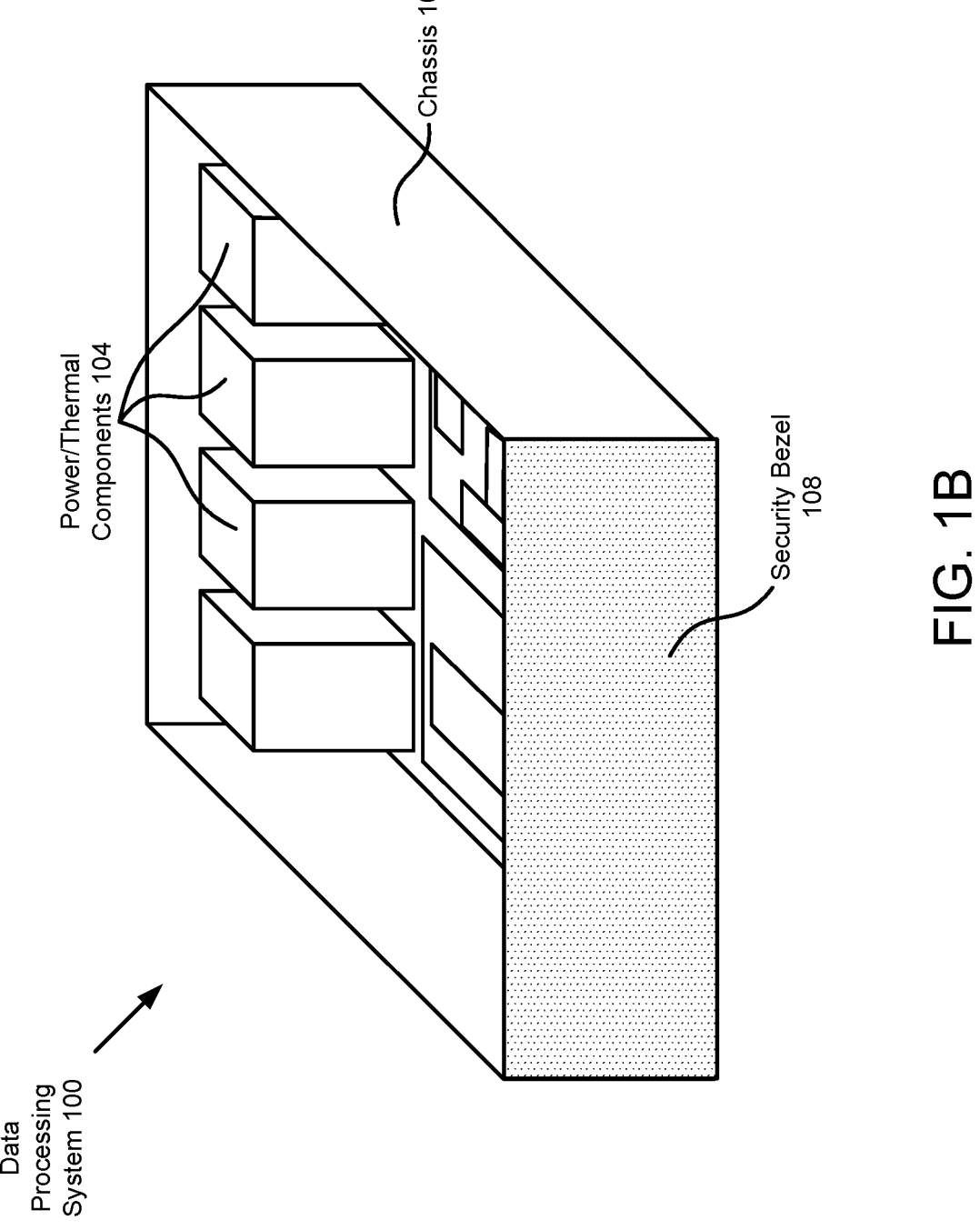

Turning to FIG. 1B, a diagram illustrating data processing system 100 in accordance with an embodiment is shown. As previously discussed, data processing system 100 may provide computer implemented services. To do so, data processing system 100 may include various hardware components that provide various functionalities on which the computer implemented services depend. However, access to the hardware components, provided by an opening in chassis 106, may leave data processing system 100 vulnerable to compromise, thereby increasing a likelihood of compromise to the computer implemented services. To decrease the likelihood of compromise caused by the access, data processing system 100 may include security bezel 108, as shown in FIG. 1B.

Security bezel 108 may prevent access to the hardware components positioned within an interior of chassis 106. To do so, security bezel 108 may (i) be implemented as a hollow structure with homogenous composition (e.g., the structure may be almost entirely made of sheet metal), and (ii) be positioned on a two-dimensional surface that spans a distance across the opening of chassis 106, discussed previously. By doing so, security bezel 108 may limit access to the hardware components within the interior of chassis 106 (e.g., within data processing system 100).

To provide its functionality, security bezel 108 may include (i) a front body, (ii) a rear body, and (iii) a latch mechanism. Each of these components of the security bezel may inhibit entities and/or forces from interacting with the interior of chassis 106 from an exterior of chassis 106 while allowing for flows of gasses to traverse into chassis 106 for cooling purposes.

For example, the latch mechanism may reversibly secure the front body and the rear body to chassis 106, the latch mechanism only allowing interaction with the interior if manipulated in a particular manner. Thus, the latch mechanism may screen interaction with the interior based on a manner of manipulation, the particular manner possibly manipulating the front body and/or the rear body, discussed further below with regard to FIGS. 2A-2B.

Unless the latch mechanism is manipulated in the particular manner (thereby causing possible manipulation of the front body and/or the rear body to allow the interaction), the front body and the rear body may each (i) cover the opening (e.g., the two-dimensional surface) that provides the access, and (ii) resist deformation when force is applied to security bezel 108.

To do so, the front body and the rear body may be shaped from two sheets of metal that are to be connected to one another. The material of the two sheets (e.g., sheet metal) may be shaped to impart a physical strength of the material to the security bezel. For example, the front body may be shaped from a first sheet of the two sheets to be a front portion of the hollow structure, and the rear body may be shaped from a second sheet of the two sheets to be a back portion of the hollow structure.

Figure 2A:
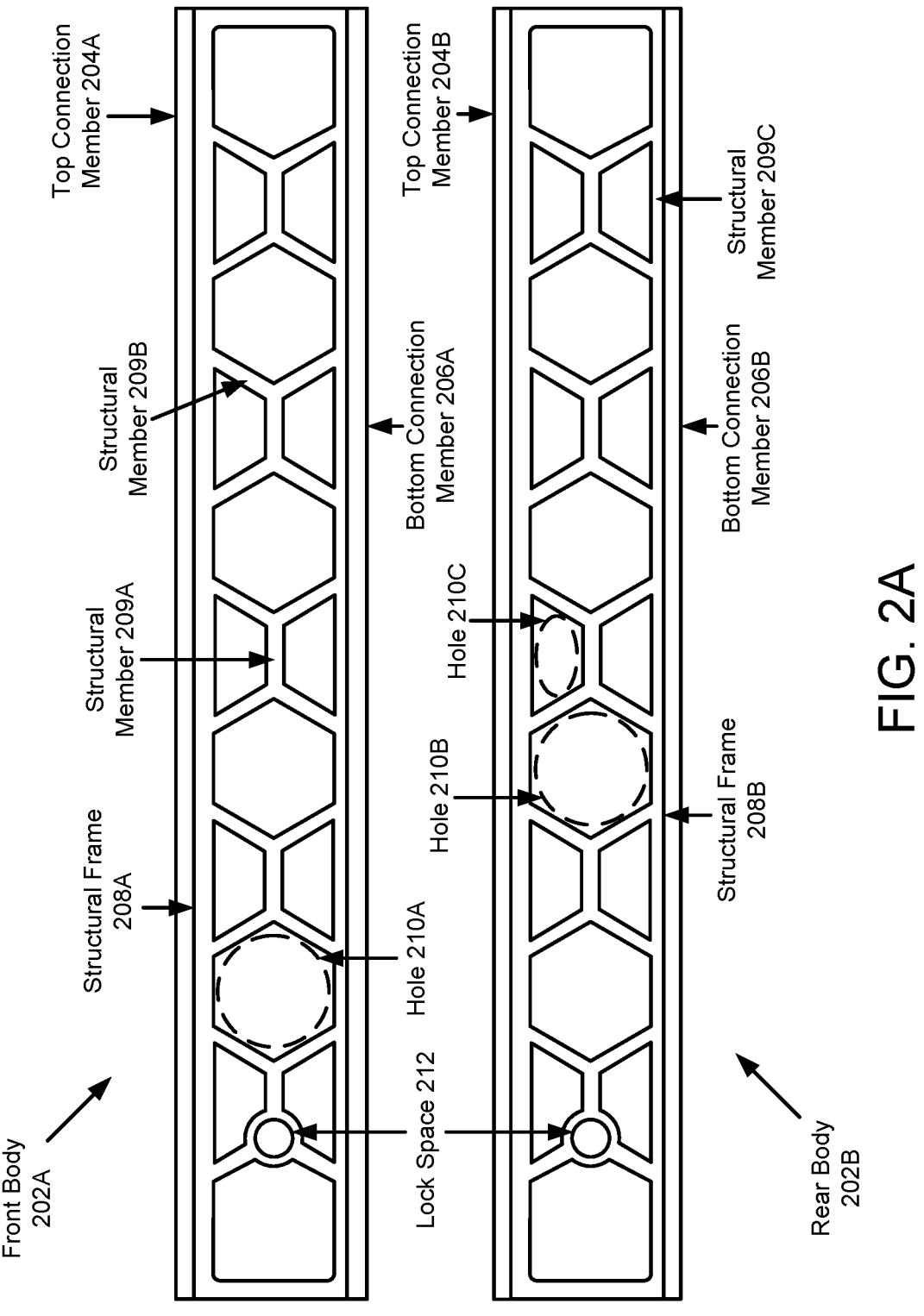
FIGS. 2A-2B show diagrams illustrating a security bezel in accordance with an embodiment.

For example, assume a front view of the security bezel (rather than the perspective view of FIG. 1B). The front body and the rear body, once connected to one another, may enclose a volume of space (e.g., the hollow portion of the hollow structure in which a latch mechanism, a lock, and/or empty space may reside). The front body may have a same length as the hollow structure and may be positioned as depicted in FIG. 2A (discussed further below) with a front side of the front body (e.g., 202A) facing out of the page, and a back side of the front body at least partially enclosing the volume. The rear body may also have the same length as the hollow structure and may be positioned behind the front body (e.g., into the page, and with an orientation as depicted in FIG. 2A with a front side of rear body 202B facing out of the page). A front side of the rear body may at least partially enclose the volume and a back side of the rear body may face into the page.

Figure 2B:
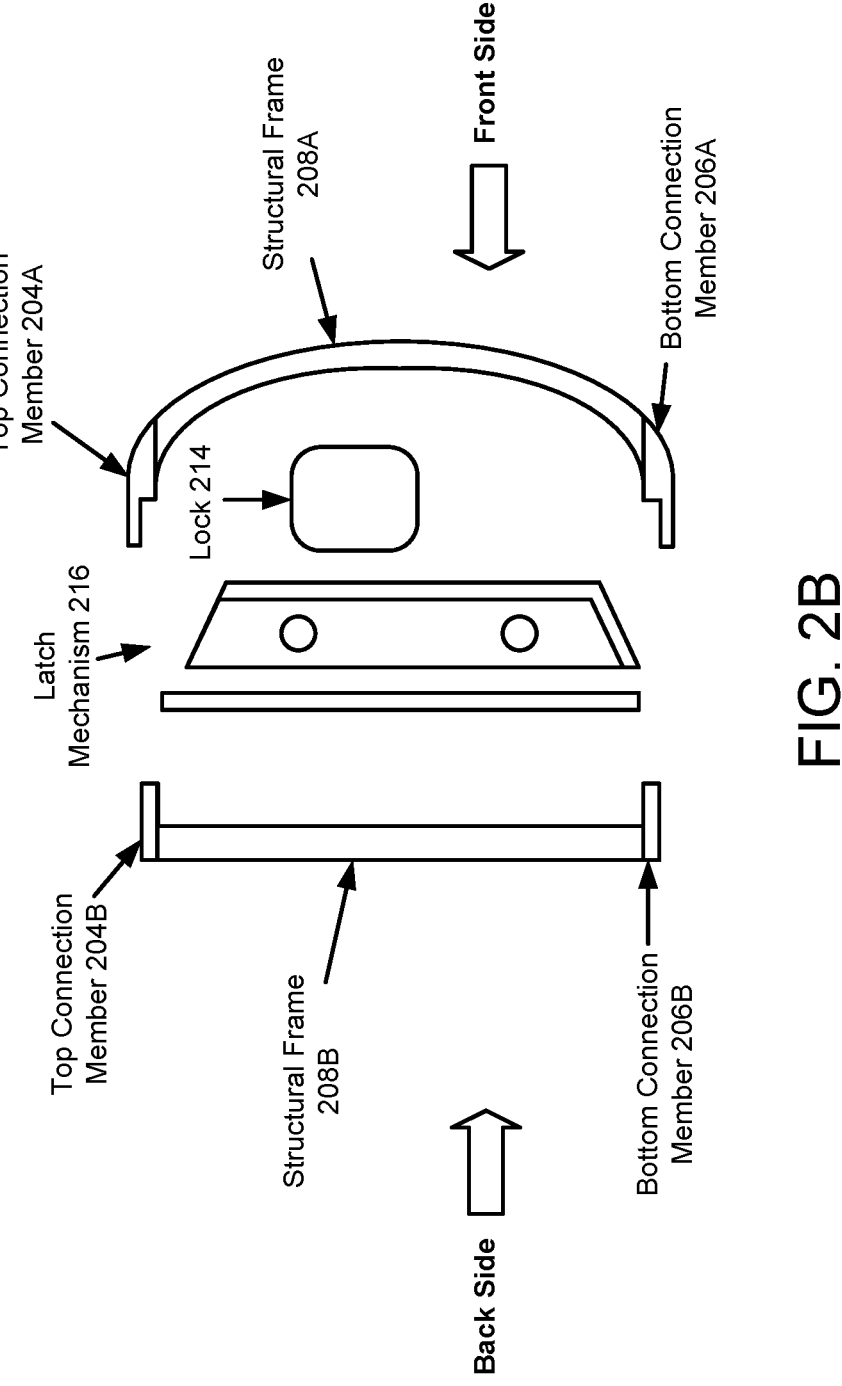

For additional information regarding the positioning and/or orientation of the front body and the rear body to form the security bezel, refer to FIG. 2B.

The two sheets of material may be manipulated using various processes to shape the front body and/or the rear body. For example, stamping one or more shapes into the first sheet of metal (thereby cutting the first sheet with the one or more shapes) may result in a structure resembling the front body. Similarly, for example, the second sheet may be stamped with at least one shape resulting in a structure resembling the rear body. In an embodiment, the stamped sheets of metal may be further manipulated (e.g., curved) to obtain the front body and/or the rear body.

By shaping the sheets of metal, various types of members may be formed. These types of members may include (i) top connection members (a first type of the types), (ii) structural frames (e.g., structures that include a second type of the types and holes to facilitate the traversal of the gasses), and/or (iii) bottom connection members (a third type of the types), each imparting physical strength to the security bezel. For example, the front body and the rear body may be connected to one another using the top connection members and/or the bottom connection members. For additional information regarding the various types of members and/or the holes, refer to FIGS. 2A-2B.

By being shaped from the two sheets of metal, the resulting security bezel may be more easily recycled, and less energy intensive to manufacture when compared to manufacturing of other types of structural members. For example, other methods of manufacture such as milling blocks of material may be more energy intensive, costly, and may result in structures that are more challenging to recycle.

While illustrated in FIG. 1B with a limited number of specific components, a system may include additional, fewer, and/or different components without departing from embodiments disclosed herein.

As noted above, a security bezel may be used to secure hardware components in a chassis. To do so, the security bezel may include a front body, a rear body, and/or a latch mechanism. FIGS. 2A-2B show diagrams illustrating examples of a front body and a rear body in accordance with an embodiment. FIG. 2B shows a diagram illustrating an example of a latch mechanism, the front body, the rear body, and/or other components of a security bezel in accordance with an embodiment.

Turning to FIG. 2A, a first diagram illustrating at least a portion (e.g., front and rear bodies) of a security bezel in accordance with an embodiment is shown. It will be appreciated that the security bezel of FIG. 2A may be a same security bezel as that discussed with regard to FIG. 1B (e.g., 108) and may include front body 202A and rear body 202B, as shown. In FIG. 2A, the viewpoint may be from a front of front body 202A and a front of rear body 202B (e.g., the front being how each body would be viewed from outside of the security bezel) rather than from a perspective view of the security bezel as shown in FIG. 1B.

It will be appreciated that although described as being connected to one another to form the security bezel, front body 202A and rear body 202B are depicted in FIG. 2A as being unconnected in FIGS. 2A-2B to illustrate features of each of these portions of the security bezel.

As discussed above, the security bezel may facilitate security management for various hardware components of data processing system 100 by preventing access to the hardware components. To prevent access to the hardware components, the security bezel may be implemented using a rigid, hollow, and self-supporting super structure (a hollow cover body) adapted to cover an opening (e.g., in chassis 106, previously discussed) that provides access to the hardware components. By having this hollow structure cover the access, the security bezel may screen access to an interior of a chassis (e.g., 106) while enabling airflow into and/or out the chassis.

To do so, front body 202A and rear body 202B may each include structural frames (e.g., structural frames 208A-208B). These structural frames may each include various holes (e.g., holes 210A-210C) and various structural members (e.g., structural members 209A-209C, forming interconnecting branches by which the various holes are bound, and therefore separated by, as shown in FIG. 2A). Each of these is discussed below.

The structural members may be arranged to partially cover a surface (e.g., the two-dimensional surface that spans a distance across the opening of chassis 106) and form a self-supporting structure (e.g., structural frame 208A and/or 208B). For example, structural members of structural frame 208A (e.g., 209A-209B) may make up at least a portion of the front side of the security bezel. Similarly, for example, structural members of structural frame 208B (e.g., 209C) may make up at least a portion of the back side of the security bezel.

Each structural member of the structural members may (i) span a distance between two points on the surface (e.g., each of these points being a node at which some of the branches of the material connect to one another on a respective structural frame), and (ii) resist deformation due to force applied to any number of the structural members.

As previously mentioned, the structural members may bound the holes through which gases may traverse. More particularly, each hole of the holes may be at least partially bound by a portion of the structural members.

These boundaries (facilitated by the structural members) may result in an arrangement of at least a portion of the holes into an at least partial honeycomb pattern (discussed further below). While described with respect to a honeycomb pattern, it will be appreciated that the holes may take on other patterns without departing from embodiments disclosed herein.

Additionally, and as previously mentioned, the holes may have shapes and sizes that prevent general physical access to an interior of the chassis. Thus, entities and/or forces may be inhibited from interacting with the hardware components from an exterior of the chassis. However, the holes may facilitate movement of objects (e.g., specialized tools) below a size threshold through the surface while preventing components within the chassis from being removed through the holes.

For example, these holes may facilitate the insertion of a key into a lock residing in lock space 212. By inserting the key into the lock to manipulate the lock, the lock may further manipulate the latch mechanism (not shown in FIG. 2A). Thus, the latch mechanism may be manipulated in a particular manner (assuming a correct key is used to provide authority for the access) to facilitate access to the hardware components, as discussed with respect to FIG. 1B.

It will be appreciated that although front body 202A and rear body 202B are illustrated as having a partial honeycomb pattern (referred to as a "first pattern") in FIG. 2A, the security bezel may be fabricated to have a complete honeycomb pattern (e.g., a pattern that includes more than one partial honeycomb pattern). For example, the security bezel may be fabricated to include the first pattern and a second pattern that is similar to the first pattern. The first pattern and the second pattern may be physically connected to one another, and the second pattern may be positioned above or below the first pattern (from the viewpoint of FIG. 2A). By fabricating the security bezel to include any number of partial honeycomb patterns positioned above or below the first pattern, the security bezel may be fabricated to have a complete honeycomb pattern.

As previously discussed with regard to FIG. 1B, front body 202A and rear body 202B may further include top connection members 204A-204B and bottom connection members 206A-206B. These connection members may (i) impart physical strength to the security bezel, and (ii) connect front body 202A and rear body 202B.

For example, top connection member 204A may connect to top connection member 204B, and bottom connection member 206A may connect to bottom connection member 206B. Thus, the top and bottom sides of front body 202A and rear body 202B may be connected to form the security bezel.

To do so, top connection member 204A may have a first shape adapted to hook, and/or otherwise connect to top connection member 204B. For example, top connection member 204A may be rounded and hook into the page to connect to top connection member 204B that may extend out of the page. Bottom connection members 206A-206B may connect similarly to top connection members 204A-204B, respectively.

For additional information regarding the shape of the connection members, refer to FIG. 2B.

As noted above, portions of a security bezel (e.g., 108) may be shaped from two sheets of metal. Once shaped, these two sheets of metal may be positioned with one another to form the security bezel. FIG. 2B shows a diagram illustrating at least a portion of the security bezel.

Turning to FIG. 2B, a second diagram illustrating at least a portion of a security bezel in accordance with an embodiment is shown. It will be appreciated that the security bezel of FIG. 2B may be a same security bezel as that discussed with regard to FIG. 1B (e.g., 108) and may include front body 202A, rear body 202B, and/or latch mechanism 216, as shown. In FIG. 2B, the viewpoint may be from a side (e.g., a left side with respect to the viewpoint of FIG. 2A) of front body 202A and a side of rear body 202B rather than from a perspective view of the security bezel as shown in FIG. 1B.

As discussed above, the top and bottom sides of front body 202A and rear body 202B may be connected to form the security bezel. To do so, top connection member 204A may connect to top connection member 204B, and bottom connection member 206A may connect to bottom connection member 206B.

Top connection member 204A may, for example, be shaped from the first sheet of the two sheets of metal. However, unlike the stamping process for obtaining structural frame 208A, top connection member 204A may be manipulated using non-subtractive processes. For example, a top side of the first sheet may be folded (e.g., bent) to shape the top side into top connection member 204A.

As seen in FIG. 2B, and as discussed previously, top connection member 204A may be shaped to extend toward a back side of the security bezel (e.g., as a hook extending toward rear body 202B). By doing so, top connection member 204B may more easily connect to top connection member 204A. Additionally, to connect top connection member 204B to top connection member 204A more easily, top connection member 204B may be shaped from a top side of the second sheet of the two sheets to extend toward a front side of the security bezel. Thus, these connection members (204A-204B) may facilitate connection between a top side of front body 202A and a top side of rear body 202B.

Bottom connection members 206A-206B may each be shaped similarly but using a bottom side of the first sheet and the second sheet. Thus, all of these connection members (204A-206B-both top and bottom) may facilitate connection between front body 202A and rear body 202B. The connection may be made using any method of connecting components to one another.

As noted above, once connected, front body 202A and rear body 202B may enclose a volume of space in which lock 214, latch mechanism 216, and/or empty space may reside.

To enclose this volume when connected, structural frame 208A may be curved, the inside of the curve facing the back side of the security bezel. Additionally, in an embodiment, structural frame 208B may be flat (or substantially flat, there may be some bowing or deviation). Therefore, when front body 202A is connected with rear body 202B, the structural frames may enclose the volume.

While described with respect to structural frames 208A-208B having curved and flat shapes, respectively, it will be appreciated that the structural frames may take on other combinations of flat and curved shapes without departing from embodiments herein. For example, as long as the volume is enclosed, structural frames 208A-208B may (respectively) be flat and curved, or curved and curved. However, if structural frames 208A-208B are flat and flat, for example, a substantially negligible volume may be enclosed. Consequently, utility such as lock 214 and/or latch mechanism 216 may not fit in the enclosed volume.

While illustrated in FIGS. 2A-2B with a limited number of specific components, a security bezel may include additional, fewer, and/or different components without departing from embodiments disclosed herein.

As noted above, to decrease the likelihood of compromise of the hardware components, the data processing system may include a security bezel to limit access to the hardware components. To do so, security bezel may be implemented as a hollow structure with homogenous composition (e.g., the structure may be made entirely of sheet metal). The structure may include various types of members to resist forces applied to the security bezel, and holes to facilitate the traversal of gases for thermal regulation of the hardware components.

Additionally, this structure may be positioned on a two-dimensional surface that spans a distance across the opening of the enclosure. By doing so, the security bezel (e.g., 108) may limit access to the hardware components within the interior of the enclosure, thereby decreasing the likelihood of compromise of the hardware components on which computer implemented services depend. Thus, a likelihood of compromise to the computer implemented services may also be decreased.

Figure 3:
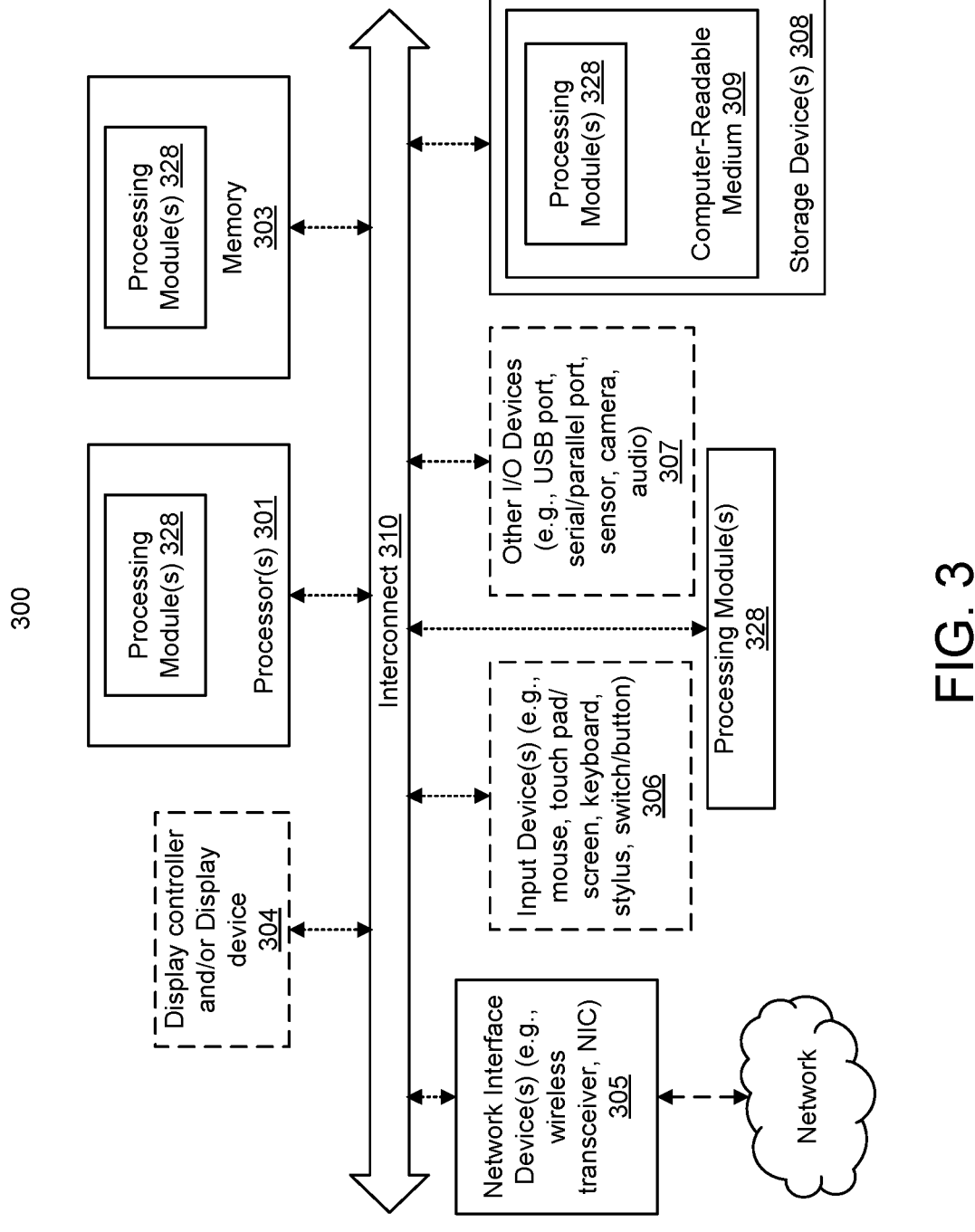
FIG. 3 shows a block diagram illustrating a data processing system in accordance with an embodiment.

Any of the components illustrated in FIGS. 1A-2B may be implemented with and/or used in conjunction with one or more computing devices. For example, the security bezel may be used to secure a chassis in which components of a data processing system may be positioned (e.g., processors, memory, etc.). Turning to FIG. 3, a block diagram illustrating an example of a data processing system (e.g., a computing device) in accordance with an embodiment is shown. For example, system 300 may represent any of data processing systems described above performing any of the processes or methods described above. System 300 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 300 is intended to show a high-level view of many components of the computer system. However, it is to be understood that additional components may be present in certain implementations and furthermore, different arrangement of the components shown may occur in other implementations. System 300 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 300 includes processor 301, memory 303, and devices 305-307 via a bus or an interconnect 310. Processor 301 may represent a single processor or multiple processors with a single processor core or multiple processor cores included therein. Processor 301 may represent one or more general-purpose processors such as a microprocessor, a central processing unit (CPU), or the like. More particularly, processor 301 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 301 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 301, which may be a low power multi-core processor socket such as an ultra-low voltage processor, may act as a main processing unit and central hub for communication with the various components of the system. Such processor can be implemented as a system on chip (SoC). Processor 301 is configured to execute instructions for performing the operations discussed herein. System 300 may further include a graphics interface that communicates with optional graphics subsystem 304, which may include a display controller, a graphics processor, and/or a display device.

Processor 301 may communicate with memory 303, which in one embodiment can be implemented via multiple memory devices to provide for a given amount of system memory. Memory 303 may include one or more volatile storage (or memory) devices such as random-access memory (RAM), dynamic RAM (DRAM), synchronous DRAM (SDRAM), static RAM (SRAM), or other types of storage devices. Memory 303 may store information including sequences of instructions that are executed by processor 301, or any other device. For example, executable code and/or data of a variety of operating systems, device drivers, firmware (e.g., input output basic system or BIOS), and/or applications can be loaded in memory 303 and executed by processor 301. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 300 may further include IO devices such as devices (e.g., 305, 306, 307, 308) including network interface device(s) 305, optional input device(s) 306, and other optional IO device(s) 307. Network interface device(s) 305 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 306 may include a mouse, a touch pad, a touch sensitive screen (which may be integrated with a display device of optional graphics subsystem 304), a pointer device such as a stylus, and/or a keyboard (e.g., physical keyboard or a virtual keyboard displayed as part of a touch sensitive screen). For example, input device(s) 306 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 307 may include an audio device. An audio device may include a speaker and/or a microphone to facilitate voice-enabled functions, such as voice recognition, voice replication, digital recording, and/or telephony functions. Other IO devices 307 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 307 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 310 via a sensor hub (not shown), while other devices such as a keyboard or thermal sensor may be controlled by an embedded controller (not shown), dependent upon the specific configuration or design of system 300.

To provide for persistent storage of information such as data, applications, one or more operating systems and so forth, a mass storage (not shown) may also couple to processor 301. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 301, e.g., via a serial peripheral interface (SPI). This flash device may provide for non-volatile storage of system software, including a basic input/output software (BIOS) as well as other firmware of the system.

Storage device 308 may include computer-readable storage medium 309 (also known as a machine-readable storage medium or a computer-readable medium) on which is stored one or more sets of instructions or software (e.g., processing module, unit, and/or processing module/unit/logic 328) embodying any one or more of the methodologies or functions described herein. Processing module/unit/logic 328 may represent any of the components described above. Processing module/unit/logic 328 may also reside, completely or at least partially, within memory 303 and/or within processor 301 during execution thereof by system 300, memory 303 and processor 301 also constituting machine-accessible storage media. Processing module/unit/logic 328 may further be transmitted or received over a network via network interface device(s) 305.

Computer-readable storage medium 309 may also be used to store some software functionalities described above persistently. While computer-readable storage medium 309 is shown in an exemplary embodiment to be a single medium, the term "computer-readable storage medium" should be taken to include a single medium or multiple media (e.g., a centralized or distributed database, and/or associated caches and servers) that store the one or more sets of instructions.

The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 328, components and other features described herein can be implemented as discrete hardware components or integrated in the functionality of hardware components such as ASICS, FPGAs, DSPs or similar devices. In addition, processing module/unit/logic 328 can be implemented as firmware or functional circuitry within hardware devices. Further, processing module/unit/logic 328 can be implemented in any combination hardware devices and software components.

Note that while system 300 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A security bezel for a chassis of a data processing system, the security bezel comprising:

a hollow cover body adapted to secure access to an interior of the chassis, the hollow cover body enclosing a volume of space and spanning a two-dimensional surface through which access to the interior is provided, the hollow cover body comprises:

a front body that is curved and forms a front-most cover of the security bezel; and a rear body that is flat and forms a rear-most cover of the security bezel, the front body being directly attached to the rear body, and a hollow space is formed between the front body and the rear body when the front body is directly attached to the rear body; and a latch mechanism that is:

disposed within the hollow space between the front body and the rear body, and adapted to reversibly secure the hollow cover body to the chassis, wherein the front body has a same length as the hollow cover body, and the front body further comprising:

a first top connection member;

a first structural frame comprising:

first holes that are adapted to allow a traversal of gasses through the two-dimensional surface and that comprise a first portion of a lock space in which a lock mechanism is positioned; and first structural members adapted to resist deformation due to force applied to the first structural members; and a first bottom connection member, the first holes only being provided on the first structural frame and not on either the first top connection member or the first bottom connection member; and the rear body has the same length as the hollow cover body, and the rear body further comprising:

a second top connection member;

a second structural frame comprising:

second holes that are aligned with the first holes and adapted to allow a traversal of the gasses through the two-dimensional surface and that comprise a second portion of the lock space that is aligned with the first portion of the lock space to facilitate insertion of the lock mechanism into the lock space; and second structural members adapted to resist deformation due to force applied to the second structural members; and a second bottom connection member, the second holes only being provided on the second structural frame and not on either the second top connection member or the second bottom connection member, the first top connection member is connected to the second top connection member, and the first bottom connection member is connected to the second bottom connection member, and the front body being curved such that the first structural frame that comprises the first holes does not come into direct contact with the second structural frame that comprises the second holes when the first top connection member is connected to the second top connection member and the first bottom connection member is connected to the second bottom connection member.

2. The security bezel of claim 1, further comprising:

the lock mechanism, wherein the lock mechanism is operably coupled to the latch mechanism, the lock mechanism being disposed within the hollow space between the front body and the rear body.

3. The security bezel of claim 1, wherein the first structural members are stacked on top of the second structural members, and the first structural members are disconnected from the second structural members.

4. The security bezel of claim 3, wherein each of the second structural members are planar elements.

5. The security bezel of claim 4, wherein each of the planar elements has a substantially similar thickness to thicknesses of other planar elements.

6. The security bezel of claim 5, wherein the front body is a first unitary structure of a substantially homogenous material.

7. The security bezel of claim 6, wherein the rear body is a second unitary structure of the substantially homogenous material.

8. The security bezel of claim 1, wherein a height of the rear body is lower than a height of the front body, and the rear body is installed into the front body.

9. The security bezel of claim 1, wherein the hollow space is formed between the front body and the rear body in an entire length-wise direction of the front body and the rear body.

10. The security bezel of claim 1, wherein the first holes and the second holes remain separate and distinct from one another when the first top connection member is connected to the second top connection member and the first bottom connection member is connected to the second bottom connection member.

11. The security bezel of claim 10, wherein the front body is curved in a top to bottom direction of the front body.

12. The security bezel of claim 11, wherein the first structural members and the second structural members remain separate and distinct from one another when the first top connection member is connected to the second top connection member and the first bottom connection member is connected to the second bottom connection member.

13. The security bezel of claim 1, wherein the first structural members are only formed on the first structural frame and not on either the first top connection member or the first bottom connection member.

14. The security bezel of claim 13, wherein the second structural members are only formed on the second structural frame and not on either the second top connection member or the second bottom connection member.

15. The security bezel of claim 14, wherein the first structural members and the second structural members remain separate and distinct from one another when the first top connection member is connected to the second top connection member and the first bottom connection member is connected to the second bottom connection member.

16. The security bezel of claim 15, wherein the front body is curved in a top to bottom direction of the front body.

17. The security bezel of claim 1, wherein the front body is formed from a single one of a first sheet made of homogenous material where the first top connection member and the first bottom connection member are formed by bending a top-most side and a bottom-most side, respectively, of the first sheet, and the rear body is formed from a single one of a second sheet made of homogenous material where the second top connection member and the second bottom connection member are formed by bending a top-most side and a bottom-most side, respectively, of the second sheet.

18. The security bezel of claim 17, wherein the first sheet and the second sheet are both sheet metal.

19. An enclosure comprising:

a chassis; and a security bezel for the chassis, the security bezel comprising:

a hollow cover body adapted to secure access to an interior of the chassis, the hollow cover body enclosing a volume of space and spanning a two-dimensional surface through which access to the interior is provided, the hollow cover body comprises:

a front body that is curved and forms a front-most cover of the security bezel; and a rear body that is flat and forms a rear-most cover of the security bezel, the front body being directly attached to the rear body, and a hollow space is formed between the front body and the rear body when the front body is directly attached to the rear body; and a latch mechanism that is:

disposed within the hollow space between the front body and the rear body, and adapted to reversibly secure the hollow cover body to the chassis, wherein the front body has a same length as the hollow cover body, and the front body further comprising:

a first top connection member;

a first structural frame comprising:

first holes that are adapted to allow a traversal of gasses through the two-dimensional surface and that comprise a first portion of a lock space in which a lock mechanism is positioned; and first structural members adapted to resist deformation due to force applied to the first structural members; and a first bottom connection member, the first holes only being provided on the first structural frame and not on either the first top connection member or the first bottom connection member; and the rear body has the same length as the hollow cover body, and the rear body further comprising:

a second top connection member;

a second structural frame comprising:

second holes that are aligned with the first holes and adapted to allow a traversal of the gasses through the two-dimensional surface and that comprise a second portion of the lock space that is aligned with the first portion of the lock space to facilitate insertion of the lock mechanism into the lock space; and second structural members adapted to resist deformation due to force applied to the second structural members; and a second bottom connection member, the second holes only being provided on the second structural frame and not on either the second top connection member or the second bottom connection member, the first top connection member is connected to the second top connection member, and the first bottom connection member is connected to the second bottom connection member, and the front body being curved such that the first structural frame that comprises the first holes does not come into direct contact with the second structural frame that comprises the second holes when the first top connection member is connected to the second top connection member and the first bottom connection member is connected to the second bottom connection member.

20. A data processing system comprising:

a chassis;

hardware components positioned in the chassis; and a security bezel for the chassis, the security bezel comprising:

a hollow cover body adapted to secure access to an interior of the chassis, the hollow cover body enclosing a volume of space and spanning a two-dimensional surface through which access to the interior is provided, the hollow cover body comprises:

a front body that is curved and forms a front-most cover of the security bezel; and a rear body that is flat and forms a rear-most cover of the security bezel, the front body being directly attached to the rear body, and a hollow space is formed between the front body and the rear body when the front body is directly attached to the rear body; and a latch mechanism that is:

disposed within the hollow space between the front body and the rear body, and adapted to reversibly secure the hollow cover body to the chassis the front body has a same length as the hollow cover body, and the front body further comprising:

a first top connection member;

a first structural frame comprising:

first holes that are adapted to allow a traversal of gasses through the two-dimensional surface and that comprise a first portion of a lock space in which a lock mechanism is positioned; and first structural members adapted to resist deformation due to force applied to the first structural members; and a first bottom connection member, the first holes only being provided on the first structural frame and not on either the first top connection member or the first bottom connection member; and the rear body has the same length as the hollow cover body, and the rear body further comprising:

a second top connection member;

a second structural frame comprising:

second holes that are aligned with the first holes and adapted to allow a traversal of the gasses through the two-dimensional surface and that comprise a second portion of the lock space that is aligned with the first portion of the lock space to facilitate insertion of the lock mechanism into the lock space; and second structural members adapted to resist deformation due to force applied to the second structural members; and a second bottom connection member, the second holes only being provided on the second structural frame and not on either the second top connection member or the second bottom connection member, the first top connection member is connected to the second top connection member, and the first bottom connection member is connected to the second bottom connection member, and the front body being curved such that the first structural frame that comprises the first holes does not come into direct contact with the second structural frame that comprises the second holes when the first top connection member is connected to the second top connection member and the first bottom connection member is connected to the second bottom connection member.

\* \* \* \* \*